United States Patent [19]
Ganapol et al.

[11] Patent Number: 5,700,045
[45] Date of Patent: Dec. 23, 1997

[54] UNIVERSAL QFP TRAY TRANSFER METHOD

[75] Inventors: David Ganapol, Scotts Valley; Gary Small, Los Gatos, both of Calif.

[73] Assignee: VLSI Technology, Inc., San Jose, Calif.

[21] Appl. No.: 677,150

[22] Filed: Jul. 9, 1996

Related U.S. Application Data

[63] Continuation-in-part of Ser. No. 78,529, Jun. 15, 1993, abandoned.

[51] Int. Cl.$^6$ ........................................ B66C 1/02
[52] U.S. Cl. ............................... 294/64.1; 414/737
[58] Field of Search ........................ 294/64.1–65, 2; 901/40; 414/737, 752; 29/743; 206/328, 332

[56] References Cited

U.S. PATENT DOCUMENTS

| | | | |
|---|---|---|---|
| 3,205,057 | 9/1965 | Bernard et al. | 294/64.1 |
| 3,482,682 | 12/1969 | Cronkhite | 206/332 |
| 4,557,514 | 12/1985 | Cushman et al. | 901/40 |
| 4,639,030 | 1/1987 | Bini | 294/64.1 |
| 4,799,722 | 1/1989 | Marzinotto | 294/64.1 |

FOREIGN PATENT DOCUMENTS

| | | | |
|---|---|---|---|
| 105611 | 1/1967 | Denmark | 294/64.1 |
| 1598795 | 9/1981 | United Kingdom | 294/64.1 |

*Primary Examiner*—Dean Kramer
*Attorney, Agent, or Firm*—Karen S. Perkins

[57] ABSTRACT

An improved method for transferring a semiconductor carrier tray is disclosed. The method herein provides for transferring a semiconductor carrier tray from a first location to a second location by first positioning a cap member to cover the mouth of at least one cup of a semiconductor carrier tray. The capping member contacts the uppermost surface of the cup wall. A partial vacuum is applied to the capped cup, and atmosphere is evacuated from the capped cup, adhering the semiconductor tray to the capping member. Movement of the capping member causes movement of the carrier tray from a first location to a second location. When the carrier tray has been positioned at its final destination, the vacuum is released causing separation of the carrier tray and the capping member. A vacuum cap apparatus is also disclosed.

6 Claims, 7 Drawing Sheets

UNIVERSAL QFP TRAY TRANSFER METHOD

CROSS-REFERENCE TO RELATED APPLICATION

This is a continuation-in-part of U.S. application Ser. No. 08/078,529, filed Jun. 15, 1993, now abandoned, the disclosure of which is incorporated by reference.

TECHNICAL FIELD

This invention relates to an improved method of handling chip carrier trays, and for a vacuum cap apparatus for use in the method.

BACKGROUND OF THE INVENTION

Semiconductor chips are produced and packaged in a variety of ways. Generally, individual processing operations take place upon individual semiconductor chips or chip packages. However, handling individual chip packages is not convenient for many operations. Therefore, chip carrier devices, which carry a multiplicity of chip packages within a convenient holder, have been developed. A variety of chip carrier devices, for handling or shipping a number of packaged semiconductor chips, are commercially available.

FIG. 1 shows one type of carrier tray 10, which is used for handling quad flat pack (QFP) semiconductor packages. Standardized carrier trays 10 are available from a variety of sources. These carrier trays often meet JEDEC (Joint Electronic Device Engineering Counsel) standards or registered outlines of the Electronic Industries Association (EIA) regarding internal and/or external size and shape parameters. Such trays are available commercially from a variety of sources, including R. H. Murphy Co., Inc. (Amherst, N.H.). For example, as shown in FIG. 1, a molded stackable tray 10 provides a patterned group of wells 12 (open-bottomed housings) and cups 14 (closed-bottomed housings) for holding QFP packages.

The trays 10 nest into one another for handling, storage or transport (not shown). The trays 10 generally provide tongue-and-groove integration to maintain a stack of trays 10 as a carryable unit. Carrier trays such as that shown are generally vacuum molded, and have limited mechanical strength.

Generally, the open-bottomed well 12 provides a square or rectangular space in which to insert a semiconductor package 16. As shown in FIG. 2 (taken through line 2—2 of FIG. 1), the well 12 includes a wall 18 portion which surrounds and defines the well 12. A moat 20, which protects the semiconductor package leads, is present around the perimeter of the well base. The well 12 does not have a contiguous base portion, as is present in the tray cups 14. Instead, the bottom of the well 12 is open. The open well 12 design provides savings in both weight and manufacturing costs when compared to cup 14 design, and permits more flexibility of the tray. However, a number of cups 14 are provided in each tray in order to facilitate handling of the tray 10.

The closed-bottomed cup 14 corresponds to the dimensions of the well 12, and, like a well 12, provides a square or rectangular space in which to insert a semiconductor package 16. As shown in FIG. 3 (taken through line 3—3 of FIG. 1), the cup 14 is defined by a perimeter of walls 18. A moat 20 is present to protect the semiconductor package leads about the perimeter of the well base. The cup 14 also includes a contiguous base portion 22. The cup design provides rigidity to the carrier tray, but at a cost in both weight and manufacturing price. Cups 14 are also included within the package design for ease of handling in vacuum-transport of the trays.

When packaged chips are electrically tested, for example, it is common to place a chip carrier tray full of semiconductor packages, or a stack of such chip carrier trays, into the "feed" bin of a processing machine. Individual chips are removed from the carrier tray and tested. After the testing (usually involving one or more individual stations within a mechanized apparatus), chip packages which have passed testing are placed within a destination tray. Generally, a first carrier tray is provided for those chips which have finished processing, or which have passed testing and are ready for further processing. Chip packages which have failed testing are placed within a second carrier tray for repair, recycling or disposal.

A prior art tray transfer system is shown in FIGS. 4a through 4d. The carrier trays are moved using vacuum tubes 24 which clamp to the flat bottom surface of the semiconductor tray cups. As shown in FIG. 4a, the base portion 22 of one or more cups 14 provides a flat surface which is suitable for adhering a vacuum tube. FIG. 4b shows a vacuum tube 24 placed in proximity to base portion 22. The vacuum tubes 24 of the prior art were, for example, tubular structures having a rubber gasket at the cup end, as shown. The vacuum tube 24 was placed at or near the base portion 22 of the cup 14. As air was pumped out of the vacuum tube 24, as shown in FIG. 4c, a partial vacuum was formed, and a vacuum seal between the vacuum tube 24 and the base portion 22 of the cup was made. Once the vacuum seal was present, as shown in FIG. 4d, any movement of the vacuum tube 24 (shown with a dotted arrow) produced a corresponding movement in the carrier tray (solid arrow). However, each design of semiconductor carrier tray may require a new vacuum head structure to align multiple tubular vacuum structures with the specific cup placement within the carrier tray being used.

FIGS. 5a and 5b show a vacuum head system 26 such as that used in the Synax SX-121H IC Handler (Shinano Electronics Co., Ltd., Japan), configured to a carrier tray as shown in FIG. 1. A series of four vacuum heads 28 are positioned for placement at the base plates of the four outermost cups. Alternate positions for the four vacuum heads are available by re-positioning the heads along the T-shaped voids 30 in the plate.

Vacuum head systems have positioning limitations. Each of the vacuum heads must be balanced across the center of gravity by a corresponding balancing vacuum head. As a result, each vacuum head system is limited as to the number of types of trays it can handle. In the vacuum head system shown in FIGS. 5a and 5b, three alternate tray configurations can be handled by positioning the four vacuum heads 28 at the three ends of T-shaped voids 30. Each new tray design can require the redesign or substitution of the vacuum head system. For example, FIG. 6 shows a tray 10 having a design which is not amenable to transfer using the prior art vacuum head system of FIGS. 5a and 5b.

SUMMARY OF THE INVENTION

In one aspect of the invention herein, an improved method for transferring a semiconductor carrier tray is disclosed. The method herein provides for transferring a semiconductor carrier tray from a first location to a second location by first positioning a cap member at the upper surface of at least one cup of a semiconductor carrier tray. The capping member closes the mouth of the cup by integrating with the uppermost wall surfaces of the cup. This provides at least one cup, each of which cups is sealed with direct contact to the capping member.

The capped cup or cups are generally at or near the carrier tray center of gravity. In a less preferred embodiment, multiple capping members are provided to align with carrier tray cups which are removed from the center of gravity.

A partial vacuum is applied to the capped cup, and atmosphere is evacuated from within each individual capped cup. The partial vacuum formed within the carrier tray cup acts to firmly adhere the cap member to the carrier tray, and provides sufficient suction to keep the capping member and the carrier tray together as the carrier tray is transported from a first location to a second location.

When the carrier tray has been positioned at its final destination, the vacuum is released. This causes separation of the carrier tray and the capping member. The capping member can then be re-positioned over another carrier tray, and the process can be repeated.

In a preferred embodiment, the capping member is a vacuum cap. The vacuum cap is attached to an apparatus which supplies a partial vacuum to the vacuum cap, and, upon demand, releases the partial vacuum Generally, the vacuum cap has a flat lower surface. Preferably the flat lower surface is slightly compressible. This "give" helps make a good contact between the vacuum cap and the upper surface of the walls of a carrier tray (e.g., the mouth of a cup). The lower surface is dimensioned to cap at least one cup of a carrier tray. Located generally medially within the lower surface of the vacuum cap is an aperture. Effective capping takes place when the top surface of all the surrounding walls which define a cup or group of cups (the mouth of the cup or cups) are in contact with the lower surface of the vacuum cap, and the aperture is positioned to evacuate the atmosphere from one or more cups. When a partial vacuum is applied through the vacuum cap, atmosphere within the cup or cups is evacuated, causing the vacuum cap and the carrier tray to adhere to one another.

The vacuum cap generally includes a rigid housing within which the compressible pad is positioned. The compressible pad is exposed at the lower region of the housing. The housing also includes conduits and/or adapters for provision and release of the partial vacuum. In a preferred embodiment, the housing of the vacuum cap includes a rotation means, so that the vacuum cap can be rotationally positioned. The rotation takes place while maintaining the lower surface in planar relationship to the carrier tray.

The tray transfer mechanism herein is generally used to transfer a standard carrier tray. A carrier tray which is amenable for transferring the device of the subject invention includes at least one cup at or near the tray center of gravity, and may include a plurality of such cups. The capped cup or cups include a perimeter of walls with which the lower compressible surface of the vacuum cap can integrate.

The Figures are drawn for clarity and are not drawn to scale. Similar members refer to similar structures throughout the Figures.

DISCLOSURE OF THE INVENTION
INCLUDING BEST MODE

A variety of semiconductor manufacturing and testing devices use a vacuum head apparatus with which to pick up and move a semiconductor carrier tray. For purposes of illustration, and not by way of limitation, the system embodied in the Synax SX-121H (Shinano Electronics Co., Ltd., Matsumoto, Japan) integrated circuit testing device will be described.

Generally, a stack of semiconductor carrier trays full of semiconductor packages to be tested is loaded into the testing machine. An empty carrier tray is loaded into each destination tray. For example, an empty carrier tray is loaded into each of the "passed" and "not passed" semiconductor loading areas.

The testing machine picks up individual semiconductor packages using a vacuum transfer mechanism. Each package is electrically tested, then placed within a destination tray, i.e., the "good" package bin or "bad" package bin. As individual packages are tested, the carrier tray containing untested packages is steadily emptied. When the last semiconductor package has been removed, the carrier tray must be moved to expose the underlying carrier tray and the semiconductor packages it carries. The empty carrier tray can be moved to cover a full destination tray, or it may be moved to an intermediate position until it is needed as a destination tray.

Figure 7A:
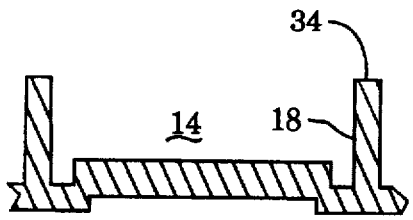
FIGS. 7a through 7d show a graphic representation of the method herein for capping and moving a carrier tray.
Figure 7B:
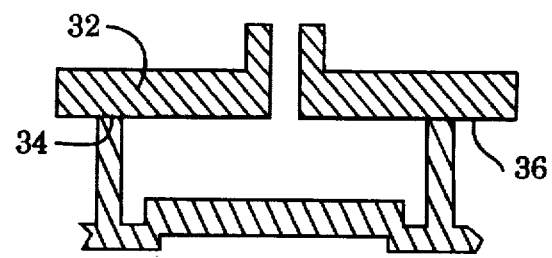

The improved vacuum cap herein does not attach to the flat bottom surface of the carrier tray cup. Rather, as shown in cross section in FIGS. 7a through 7d, the cup walls provide the structure upon which the vacuum cap attaches. As shown in FIG. 7a, each cup 14 has a general U shape which includes a flat base and surrounding cup walls 18. The top surfaces 34 of the cup walls define the cup mouth, which is the opening of the cup 14. FIG. 7b shows the positioning of a cap member 32 to integrate with the top surface 34 of the cup wall 18. The lower surface 36 of the cap member 32 is placed in contact with the top surface 34 of the cup wall 18 (the mouth of the cup) in order to "cap" the cup. The capping member covers and contacts the upper surfaces 34 of the cup walls 18. This capping acts to enclose the area within the cup.

Figure 7C:
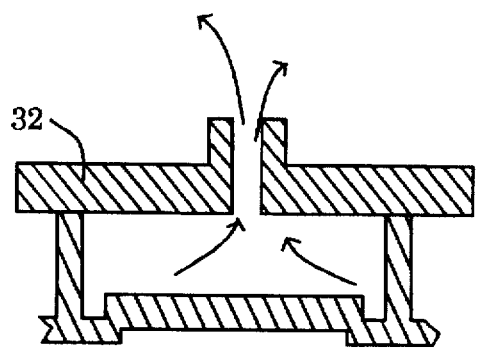
Figure 7D:
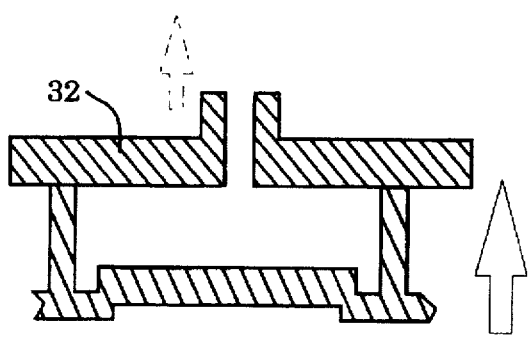

The capped cup has a base connected to walls 18. The surface of the walls 18 opposite the base (the top surfaces 34 of the walls 18, which define the mouth of the cup) are directly contacted by the capping member 32. As shown in FIG. 7c, atmosphere is evacuated from the capped cup, forming a partial vacuum within the cup. With the application of a partial vacuum, the two units are joined and, as shown in FIG. 7d, movement of the cap member 32 (dotted arrow) causes movement of the carrier tray (solid arrow).

Generally, the enclosed cup or group of cups is at or near the carrier tray center of gravity. The carrier tray is balanced when it is picked up, even though it is carried from only one point. In an alternate embodiment, multiple capping members are used to cap cups which are removed from the carrier tray center of gravity. Evacuation of the atmosphere within the capped cup acts to adhere the cap member to the carrier tray, and provides sufficient suction to keep the capping member and the carrier tray together as the carrier tray is transported from a first location to a second location.

When the carrier tray has been positioned at its destination location, the vacuum is released. The vacuum can be released by stopping the application of the partial pressure, and allowing the vacuum to dissipate. In a well-enclosed system it may take up to several seconds for the vacuum to dissipate. In a less-enclosed system the vacuum will dissipate quickly after the partial pressure is released. Alternatively, the pressure within the air pathway can be increased above ambient air pressure, which forces the vacuum cap from the cup. The release of the vacuum preferably causes quick separation of the carrier tray and the capping member 32. The capping member 32 can then be re-positioned over another carrier tray, and the process can be repeated.

The IC handling device, such as the Synax system, includes a means for providing a partial vacuum. For example, the Synax system uses a dried air source at 57 psi (4 kgf/cm$^2$) or greater to generate the differential pressures needed. For a given system, the specific partial pressure which will be sufficient to join the vacuum cap and the carrier tray will vary with the mass of the carrier tray. However, it is generally preferable to provide a partial pressure which is sufficient to hold the tray firmly in position even if small shocks are applied to the system.

Figure 1:
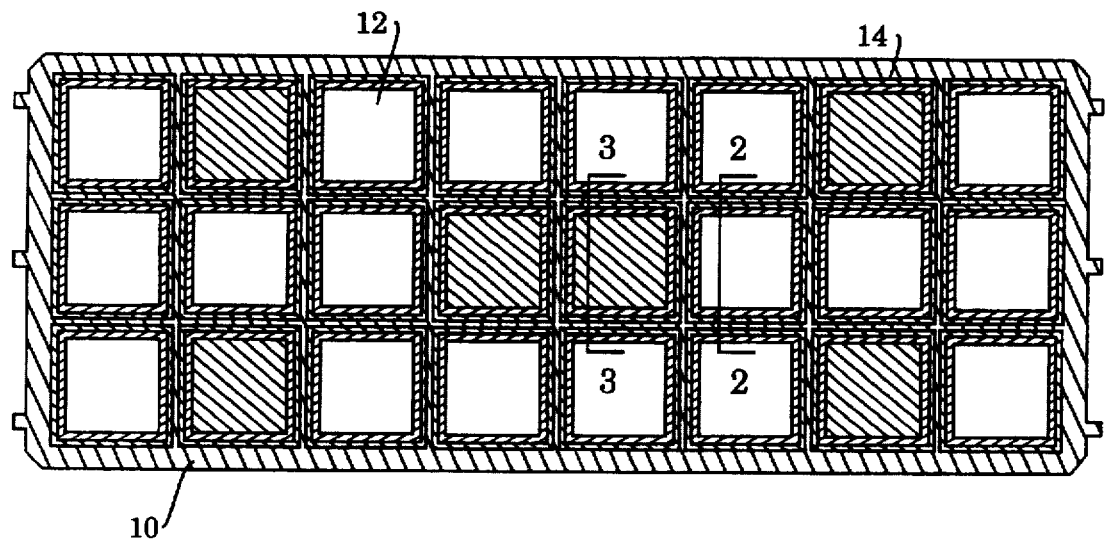
FIG. 1 shows a molded stackable carrier tray of the prior art.
Figure 2:
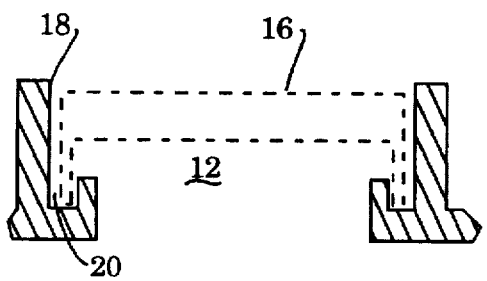
FIG. 2 is a cross-sectional view of a well of the carrier tray of FIG. 1, taken through line 2—2.
Figure 3:
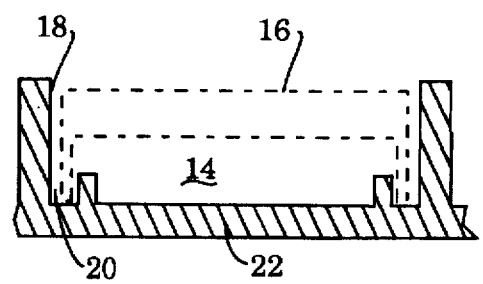
FIG. 3 is a cross-sectional view of a cup of the carrier tray of FIG. 1, taken through line 3—3.
Figure 4A:
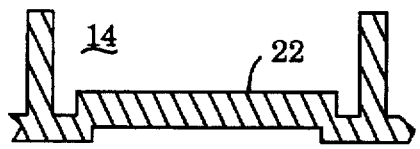
FIGS. 4a through 4d show the process of attaching a vacuum tube to the bottom plate of a carrier tray cup using a method of the prior art.
Figure 4B:
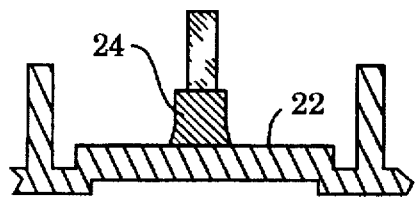
Figure 4C:
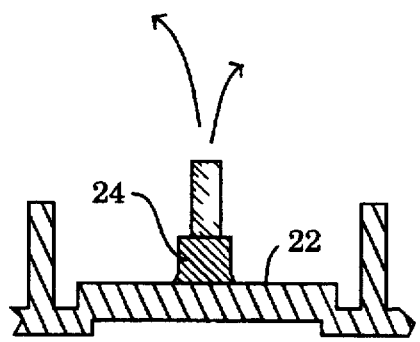
Figure 4D:
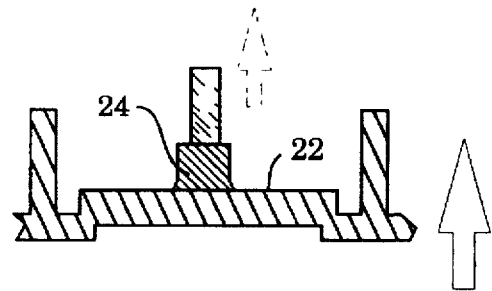
Figure 5A:
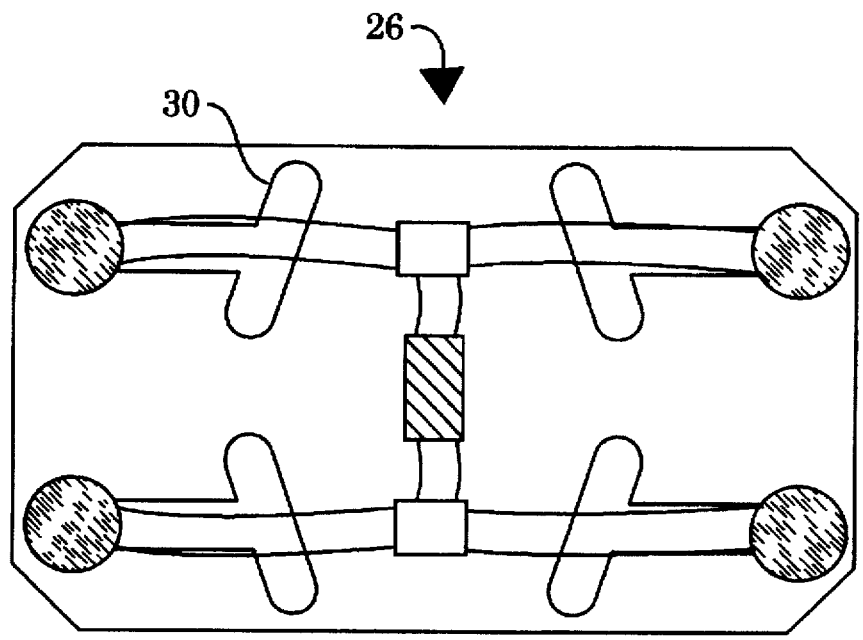
FIG. 5a shows a top view of vacuumhead system of the prior art.
Figure 5B:
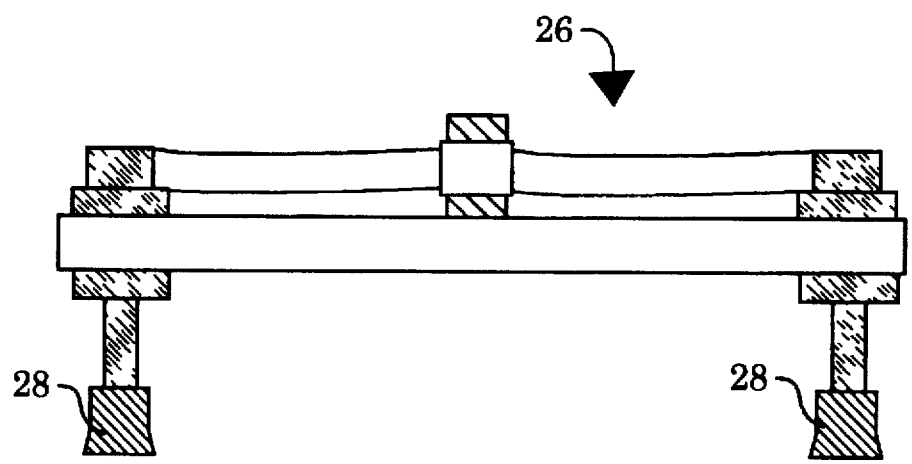
FIG. 5b shows a side view of vacuum head system of the prior art.
Figure 6:
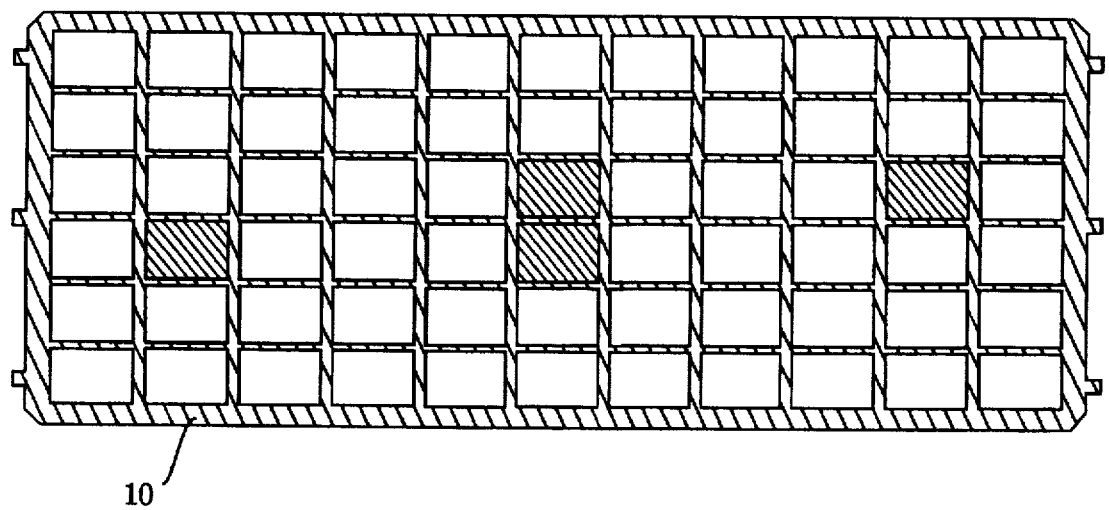
FIG. 6 shows an alternate molded stackable carrier tray of the prior art.
Figure 8E:
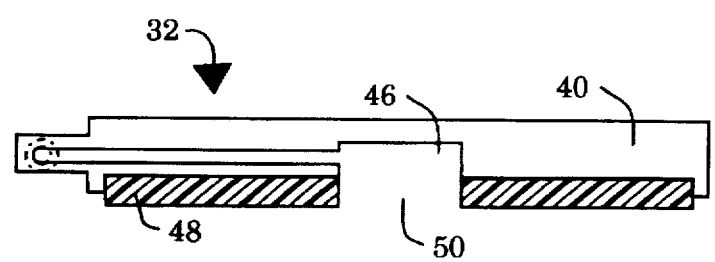
FIGS. 8a through 8e show a top view (FIG. 8a), a bottom view without pad (FIG. 8b), a bottom view with pad (FIG. 8c), an end view (FIG. 8d), and a cross-sectional view (FIG. 8e), of a preferred vacuum head herein.
Figure 8A:
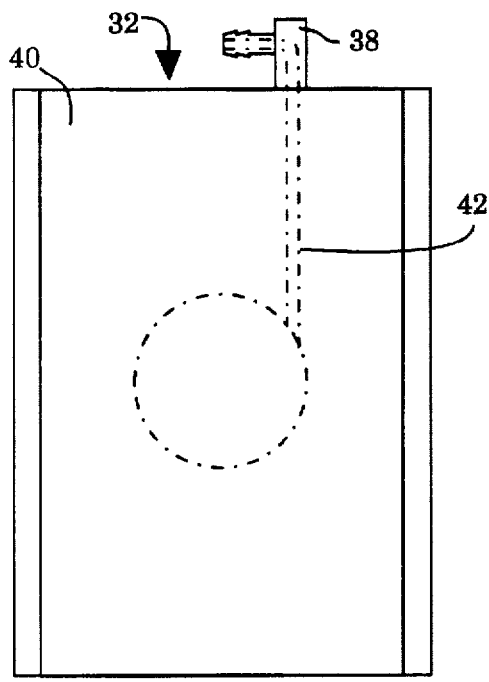

A preferred embodiment of the vacuum cap 32 is shown in FIGS. 8a through 8e. As shown in FIG. 8a in top view, the housing 40 of the vacuum cap 32 is generally square or rectangular, and includes an air pathway 42 through which differential air pressures can be applied to the lower surface of the vacuum cap 32. The air pathway stem 38 provides a connection to standard air tubing 52, which is readily commercially available. The air tubing 52 connects the air pathway 42 with the partial pressure generation means, not pictured, which is a part of the apparatus in which the vacuum cap is located. In a preferred embodiment, the air pathway stem 38 is rotationally mounted. This permits rotation of the vacuum cap 32, and facilitates the use of the vacuum cap 32 in conjunction with a variety of carrier tray embodiments.

Figure 8B:
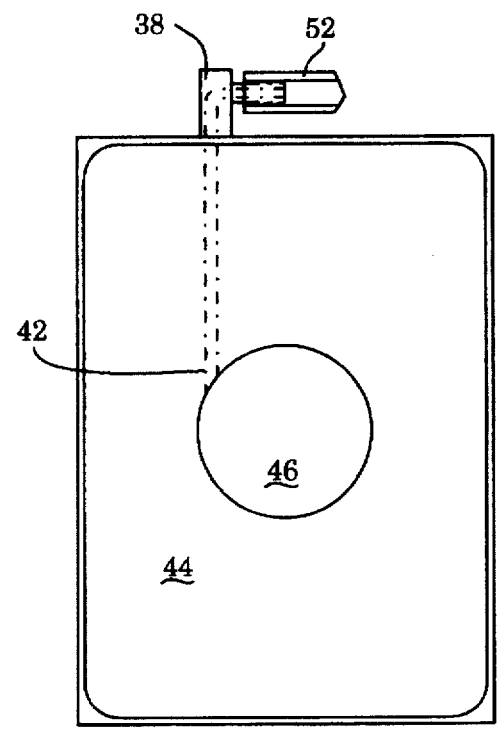

FIG. 8b shows a bottom view of the vacuum cap housing 40, without the contact pad in position. The housing 40 includes a recession 44 into which the contact pad (not shown) is fit. A central bore 46 forms part of the air pathway 42 to provide a desired air pressure flow at the lower surface of the vacuum cap 32. In one preferred embodiment, the housing 40 is approximately 85 mm in length, 60 mm in width, and 10 mm in height. The recession 44 is a rounded rectangle being approximately 83 mm in length, 58 mm in width, and 2 mm in depth. The central bore 46 is a circular bore approximately 25 mm in diameter, and 8 mm in depth, and is located medially within the vacuum cap 32. The portion of the air pathway 42 which extends between the air pathway stem 38 and the central bore 46 is approximately 2 mm in diameter along the length of the tube, and approximately 31 mm in length. While these dimensions can be varied, the dimensions given have been found to provide a stable platform with which to pick up a variety of carrier tray configurations.

Figure 8C:
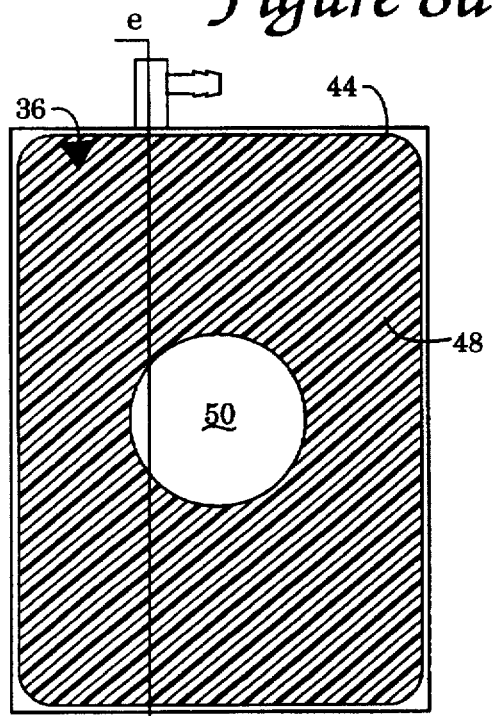

FIG. 8c shows a bottom view of the vacuum cap 32, with the contact pad 48 in position. The contact pad 48 fits within the recession 44. However, in a preferred embodiment, the contact pad 46 extends slightly beyond the base of the housing 40. Thus, a contact pad dimensioned to fit the vacuum cap described above would be a rounded rectangle approximately 83 mm in length, 58 mm in width, and 4 mm in depth. An aperture 50 provides continuity of pressure between the lower surface of the contact pad 48 and the source of differential pressure (not shown). The aperture 50 is generally dimensioned such that it is small enough to efficiently transmit the partial pressure of the air pathway to the capped cup or cups, and that it not overlap into any wells of the carrier tray. It should also be dimensioned to be sufficiently large that the carrier tray is stable as it is transported from one location to another. In a preferred embodiment, as discussed above, the aperture 50 is 25 mm in diameter.

The contact pad 48 is preferably made of a material which is compressible across its depth. However, the contact pad 48 should not allow air to permeate across its depth. Generally, when a relatively small differential of partial vacuum is used, the contact pad 48 must be a very efficient barrier to the flow of air across its depth. However, if a relatively large differential of partial vacuum is used, there can be some leakage across the contact pad 48 without significant loss of adhesion of the carrier tray. The contact pad 48 can be made of rubber, closed-pore sponge material, felted material, or the like. Preferably, the contact pad 48 is made of a spongy silicone rubber sponge material, from SFS Industries, Santa Fe Springs, Calif. (part number SF1106-63S). This material will fray if cut. However, hot-cutting has been found to be an efficient method for forming the contact pad 48. The contact pad 48 can be glued in position using silicon rubber, epoxy or the like, or it can be pressure-fit into position.

Figure 8D:
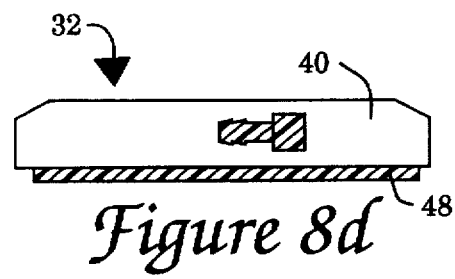

FIG. 8d shows an end view of the vacuum cap 32, showing the housing 40, the contact pad 48, and the air pathway stem 38. As shown, the contact pad 48 extends somewhat beyond the confines of the housing 40. This permits the contact pad 48 to be compressed during the capping process, while limiting the total compression. The contact pad 48 can compress until the upper surface of the carrier tray comes into contact with the housing 40. When the carrier tray meets the housing 40, further compression of the contact pad 48 is eliminated.

FIG. 8e shows a cross-sectional view of the vacuum cap 32 of FIG. 8c, taken across line e—e. The housing 40, recession 44, central bore 46, contact pad 48, and aperture 50 are shown.

The tray transfer mechanism herein is generally used to transfer a standard carrier tray. A carrier tray includes at least one cup at or near the tray center of gravity, and generally includes a plurality of such cups. The capped cup or cups include a perimeter of walls with which the lower compressible surface of the vacuum cap can integrate. The capping member can cap a single cup by covering the mouth of the cup, so that the aperture of the contact pad does not extend beyond the perimeter of walls of the capped cup. Alternatively, the capping member can cap a plurality of cups. When a plurality of cups are capped by a single capping member, the aperture extends across one or more cup wall, and air within two or more cups is evacuated. If sufficient continuous vacuum is applied, the capping member will function to pick up a carrier tray even if some portion of the aperture extends into a carrier tray well. However, it is preferable that all or substantially all of the vacuum be applied to closed cups, rather than the open wells.

Figure 9A:
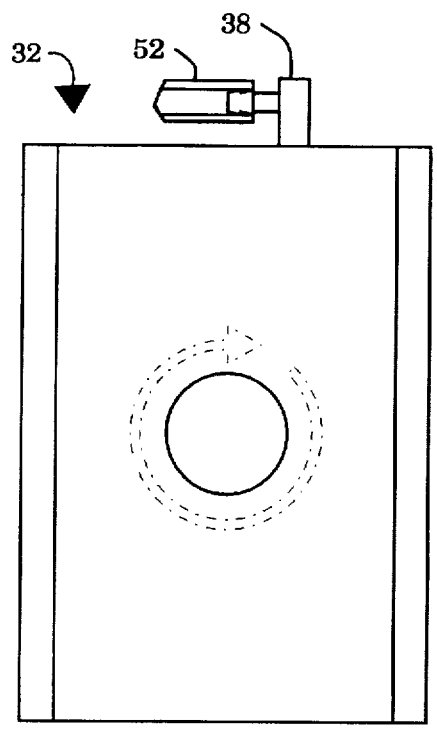
FIGS. 9a through 9c show top views (FIGS. 9a and 9b), and an end view (FIG. 9c), of a preferred vacuum cap and rotation means, as disclosed herein.
Figure 9B:
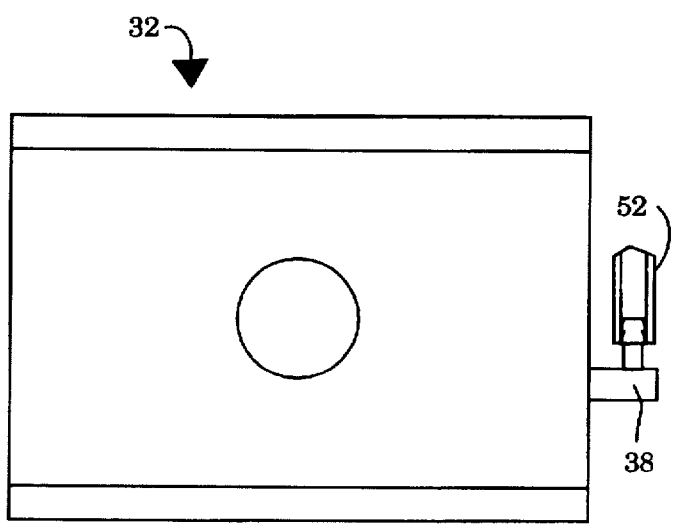
Figure 9C:
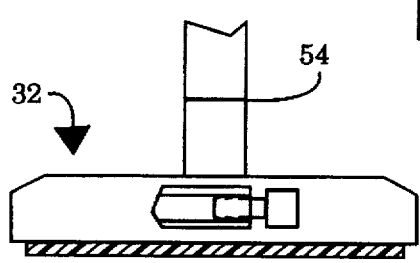

An especially preferred embodiment of the vacuum cap 32 herein is shown in FIGS. 9a through 9c. FIGS. 9a and 9b show top views of a vacuum cap 32. The vacuum cap 32 has been mounted for 360° rotation through the horizontal plane. Preferably, the air tubing 52 has sufficient length that it can remain joined to the vacuum cap 32 throughout all or most of a full rotation, without separating from the air pathway stem 38. Rotation of the air pathway stem 38 also assists in maintaining the integrity of the vacuum cap system as the vacuum cap is rotated.

As shown by the dotted arrow in FIG. 9a, a full range of rotation is preferable, although a 90° rotation may be adequate for many applications. FIG. 9b shows the device of FIG. 9a after a 90° rotation. When a 360° rotation is provided, it is generally convenient to include detents every 90° to aid in alignment of the vacuum cap 32 with the carrier tray cups.

FIG. 9c shows an end view of the vacuum cap 32 of FIG. 9a. A rotational joint 54 is present. A variety of rotational joints 54 are know to the art. In one preferred embodiment, the rotation is provided by a ball-and-pin joint having ball bearing friction reduction. Little or no movement out of the horizontal plane of rotation is allowed.

While the invention has been described in connection with several exemplary embodiments, it will be understood that many modifications will be apparent to those of ordinary skill in the art in light of the above disclosure. Such modifications may include using substitute materials, smaller or greater dimensions, varying the member and placement of spacer tray cups, and so forth, to achieve substantially the same results in substantially the same way. Reference to the following claims should be made to determine the scope of the claimed invention.

We claim:

1. A method for transferring a semiconductor carrier tray having individual cups and wells, said semiconductor carrier tray being transferred from a first location to a second location, said method comprising:
   (a) positioning a cap member to contact at least one individual cup of a semiconductor carrier tray; wherein said cup includes a base portion, and a plurality of wall portions having upper surfaces, said cap member directly contacting the upper wall surfaces of the individual cup to provide a capped cup;
   (b) evacuating atmosphere from the capped cup to provide a partial vacuum within the cup, wherein the partial vacuum within the cup acts to join the cap member and the carrier tray;
   (c) moving the cap member and the joined carrier tray to a second location; and
   (d) releasing the partial vacuum in the carrier tray cup to separate the carrier tray from the cap member.

2. A method of claim 1, said method further comprising:
   (d) releasing the partial vacuum in the carrier tray cup by increasing the atmospheric pressure within the cup, to separate the carrier tray from the cap member.

3. A method of claim 1 wherein said evacuating step joins said cap member and said carrier tray at a cup at or near the carrier tray center of gravity.

4. A method of claim 1 wherein a plurality of cups are capped.

5. A method for transferring a semiconductor carrier tray having individual cups and wells, said semiconductor carrier tray being transferred from a first location to a second location, said method comprising:
   (a) positioning a cap member to contact the mouth of at least one individual cup of a semiconductor carrier tray, to provide a capped cup;
   (b) evacuating atmosphere from the capped cup to provide a partial vacuum within the cup, wherein the partial vacuum within the cup acts to join the cap member and the carrier tray;
   (c) moving the cap member and the joined carrier tray to a second location; and
   (d) releasing the partial vacuum in the carrier tray cup to separate the carrier tray from the cap member.

6. A method of claim 5 wherein a plurality of cups are capped.

* * * * *